(12) United States Patent
Park et al.

(10) Patent No.: US 7,415,685 B2
(45) Date of Patent: Aug. 19, 2008

(54) METHOD OF VERIFYING THE POWER OFF EFFECT OF A DESIGN ENTITY AT REGISTER TRANSFER LEVEL AND METHOD OF MODELING THE POWER OFF EFFECT

(75) Inventors: Bong-Il Park, Yongin-si (KR); Jeong-Joo Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 120 days.

(21) Appl. No.: 11/506,668

(22) Filed: Aug. 18, 2006

(65) Prior Publication Data

US 2007/0044052 A1   Feb. 22, 2007

(30) Foreign Application Priority Data

Aug. 22, 2005   (KR) .................. 10-2005-0076973

(51) Int. Cl.
*G06F 17/50* (2006.01)
*G06F 17/10* (2006.01)

(52) U.S. Cl. .................. 716/5; 703/2; 703/16
(58) Field of Classification Search .............. 716/5; 703/2, 16

See application file for complete search history.

(56) References Cited

U.S. PATENT DOCUMENTS

| | | | | |
|---|---|---|---|---|
| 6,820,240 | B2* | 11/2004 | Bednar et al. | 716/1 |
| 6,883,152 | B2* | 4/2005 | Bednar et al. | 716/5 |
| 7,131,099 | B2* | 10/2006 | Schuppe | 716/18 |
| 2003/0055520 | A1* | 3/2003 | Tomii | 700/97 |
| 2004/0060023 | A1* | 3/2004 | Bednar et al. | 716/7 |
| 2004/0243958 | A1* | 12/2004 | Bednar et al. | 716/7 |
| 2006/0129954 | A1* | 6/2006 | Schuppe | 716/4 |

FOREIGN PATENT DOCUMENTS

| | | |
|---|---|---|
| JP | 09-311882 | 12/1997 |
| JP | 10-254945 | 9/1998 |
| JP | 2002-288258 | 10/2002 |
| JP | 2003-233637 | 8/2003 |
| JP | 2003-303218 | 10/2003 |

* cited by examiner

*Primary Examiner*—Phallaka Kik
(74) *Attorney, Agent, or Firm*—F. Chau & Assoc., LLC

(57) ABSTRACT

A method of verifying the power off effect of a design entity of a digital system includes a device model, a test input signal model, and a test output signal model specified in a hardware design language, at a register transfer level (RTL). The device model describes function blocks for performing predetermined functions using a plurality of power sources. The device model includes a model for a case where all of the power sources are supplied and a model for a case where one or more of the power sources are blocked. The test input signal model describes a test input signal to be input to the device model to verify the case where all of the power sources are supplied and the case where one or more of the power sources are blocked. The test output signal model describes a test output signal to be output from the device model in response to the test input signal.

12 Claims, 2 Drawing Sheets

METHOD OF VERIFYING THE POWER OFF EFFECT OF A DESIGN ENTITY AT REGISTER TRANSFER LEVEL AND METHOD OF MODELING THE POWER OFF EFFECT

CROSS-REFERENCE TO RELATED PATENT APPLICATIONS

This application claims priority to Korean Patent Application No. 10-2005-0076973, filed on Aug. 22, 2005, the disclosure of which is herein incorporated by reference in its entirety.

BACKGROUND OF THE INVENTION

1. Technical Field

The present disclosure relates to the verification of a device using a plurality of power sources having different voltage levels and, more particularly, to a method of verifying operational characteristics of a device depending on supply or block of a plurality of power sources at a register transfer level (RTL) and a method of modeling the power off effect at the RTL.

2. Discussion of Related Art

In apparatuses that are powered by built-in batteries, the power consumption should be minimized to effectively use the limited battery power over a period of time. Many apparatuses can be switched to a standby state when not in use. The amount of time that an apparatus is in a standby state can be longer than the time the apparatus is active. Only minimal power is consumed during standby mode, and the remaining power supply is blocked, so that the power consumed by the moving apparatus can be minimized. Instead of the voltage levels of power supplied to a plurality of devices comprising a mobile apparatus being identical with each other, different amounts of power can be supplied to devices capable of operating at low operating voltages and devices capable of operating only at high operating voltages, and the power consumption can be reduced.

The power supplied when a mobile apparatus operates normally and when the mobile apparatus is in a standby state can be distinguished from the power supplied when the mobile apparatus operates normally but may not be supplied when the mobile apparatus is in a standby state.

The input and output states of the devices not supplied with power in a standby state may affect a normal operation to which the standby state is later switched. To consume a minimal amount of power, mobile apparatuses should be designed in consideration of not only a distinction between various types of power and but also the case where power is supplied, the case where power is blocked, and the case where power is re-supplied after being blocked.

A Hardware Description Language (HDL) is a language used to describe the functions of a digital system for documentation, simulation or logic synthesis. In general, HDL languages can be used to design a digital system at behavior level, register transfer level (RTL), and at gate level. The behavior level describes a system by the functional characteristics of a device. A gate level model describes the function, timing, and structure of a component in terms of the structural interconnection of Boolean logic blocks. An RTL model is a model describing a system in terms of registers, combinational circuitry, low-level buses, and control circuits. Designs using the RTL specify the characteristics of a circuit by operations and the transfer of data between registers.

In a typical digital design process, verifying the logical correctness of a digital design and debugging the design are steps of the design process. For example, in the design of a digital system, operations of a device when the power sources are all supplied and when one or more of the power sources are not supplied can be verified through five steps as follows. First, a device model is defined at the register transfer level (RTL). Second, the operational characteristics of the device model are verified using a logic simulation program. Third, the device model confirmed through the verification is input to a logic synthesizer to produce a gate-level model of the device. Fourth, the operational characteristics of the gate-level model are verified using a logic simulation program. Fifth, the operational characteristics of the device model when the power sources are applied to the RTL device model and when the supply of the power sources are blocked are verified using a logic simulation program, which exercises the device model to detect logical errors in the digital design.

FIG. 1 illustrates a conventional verification environment for verifying a device model described at the RTL (hereinafter, referred to as "RTL device model 110") using a logic simulation program. Referring to FIG. 1, the verification environment includes the RTL device model 110, a model 120 for producing an input signal of the RTL device model 110, and a model 130 for verifying an output signal of the RTL device model 110.

The RTL device model 110 is a model which describes, at the register transfer level, a device which performs a predetermined function. The model 120 produces a test pattern for testing the RTL device model 110. The model 130 produces an ideal response pattern, which is the desired output of the RTL device model 110, in response to the test pattern. The response pattern is compared with an actual output pattern that is output by the RTL device model 110. Thus, the response pattern is used in verifying the validity of the RTL device model 110.

A long period of time is required to produce a gate-level model of the device using a logic synthesizer. A long time is also required to verify the operation of the gate-level model using the logic simulation program. In particular, in step five of verifying the logical correctness of the digital design, it takes a long time to verify operations of the gate-level model of the device upon supply and non-supply of various types of power.

If it is determined in the fifth step, that a problem is generated when the device model is not supplied with power, the first step may be resumed, and the design period may be increased.

SUMMARY OF THE INVENTION

According to an exemplary embodiment of the present invention, a method of verifying the power off effect of a design entity of a digital system includes a device model, a test input signal model, and a test output signal model specified in a hardware design language at a register transfer level (RTL). The device model describes function blocks for performing predetermined functions using a plurality of power sources, and includes a model for a case where all of the power sources are supplied and a model for a case where one or more of the power sources are blocked. The test input signal model describes a test input signal to be input to the device model to verify the case where all of the power sources are supplied and the case where one or more of the power sources are blocked. The test output signal model describes a test output signal to be output from the device model in response to the test input signal.

According to an exemplary embodiment of the present invention, a method of modeling the power off effect includes specifying, in a hardware definition language, a device model that describes, at a register transfer level, function blocks which perform corresponding functions using a plurality of power sources, extracting parameters corresponding to function blocks associated with powers that are blocked, among the plurality of powers, by analyzing the device model, and producing a code such that the function blocks indicated by the extracted parameters output a predetermined logic state.

According to an exemplary embodiment of the present invention, a system for verifying the power off effect of a design entity of a digital system includes: means for specifying, in a hardware definition language, a device model at a register transfer level (RTL), the device model describing function blocks for performing predetermined functions using a plurality of power sources, and including a model for a case where all of the power sources are supplied and a model for a case where one or more of the power sources are blocked; means for specifying a test input signal model at the RTL describing a test input signal to be input to the design entity to verify the case where all of the power sources are supplied and the case where one or more of the power sources are blocked; and means for specifying a test output signal model at the RTL describing a test output signal to be output from the design entity in response to the test input signal.

BRIEF DESCRIPTION OF THE DRAWINGS

The present invention will become readily apparent to those of ordinary skill in the art when descriptions of exemplary embodiments thereof are read with reference to the accompanying drawings.

DESCRIPTION OF EXEMPLARY EMBODIMENTS

Figure 1:
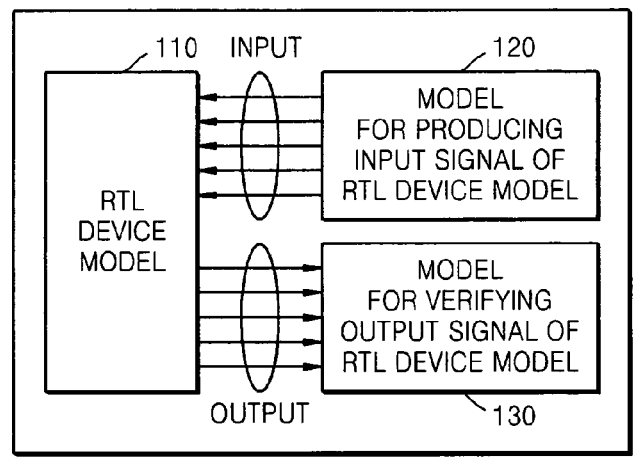
FIG. 1 illustrates a conventional verification environment for verifying a device model described at a register transfer level (RTL) using a logic simulation program.

Hereinafter, exemplary embodiments of the present invention will be described in detail with reference to the accompanying drawings. Like reference numerals refer to similar or identical elements throughout the description of the figures.

Figure 2:
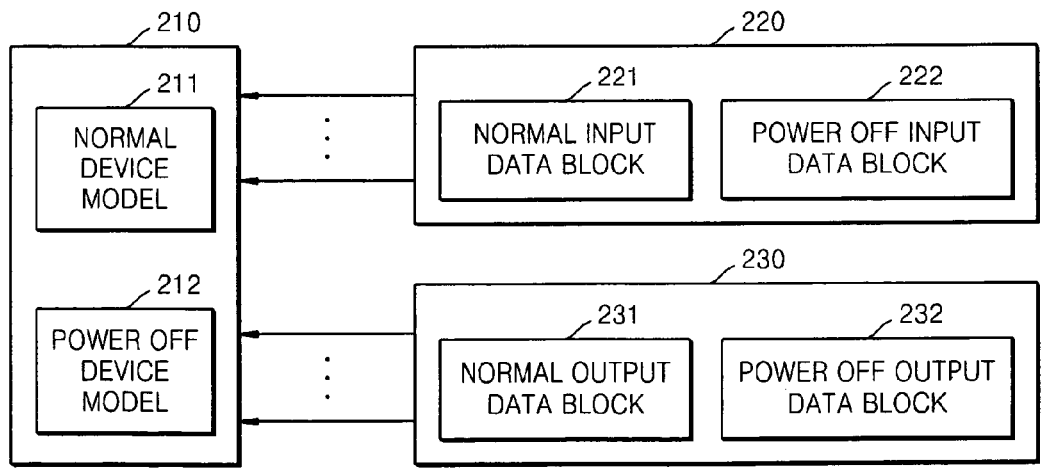
FIG. 2 is a block diagram of a method of verifying the power off effect of a design entity of a digital system, according to an exemplary embodiment of the present invention.

FIG. 2 is a block diagram of a method of verifying the power off effect of a design entity of a digital system, according to an exemplary embodiment of the present invention. Referring to FIG. 2, the method includes specifying a device model 210, a test input signal model 220, and a test output signal model 230.

The device model 210, which is described at register transfer level (RTL), performs predetermined functions using a plurality of power sources, and includes a normal device model 211 and a power off device model 212. The normal device model 211 verifies if the device performs a normal operation using all of the powers. When one or more of the power sources are blocked, the power off device model 212 changes the logic states of outputs of function blocks associated with the blocked powers. The function blocks of FIG. 2 denote registers. The logic states of the outputs of the power-blocked registers are high electrical impedance states.

The test input signal model 220 includes a normal input data block 221, which produces input data to be applied to a case where all of the plurality of power sources are used, and a power off input data block 222, which produces input data to be used in verifying a case where some of the plurality of power sources are blocked.

The test output signal model 230 includes a normal output data block 231 and a power off output data block 232. The normal output data block 231 produces data anticipated to be output by the device model 210, in response to the input data received from the normal input data block 221. The power off output data block 232 produces data anticipated to be output by the device model 210, in response to the input data received from the power off input data block 222.

To verify the normal operation state of the device in which all of the power sources are supplied, the normal device model 211, the normal input data block 221, and the normal output data block 231 are used. To verify the standby state of the device in which one or more of the power sources are blocked, the power off device model 212, the power off input data block 222, and the power off output data block 232 are used.

Function blocks comprising a device can be divided into a combinational logic circuit made up of only logic gates and a sequential logic circuit made up of not only a logic gate but also a circuit having a storage function, such as, a flip flop. When the logic gate included in the combinational logic circuit is not supplied with power, the voltage level of an output of the logic gate is an unknown state regardless of the voltage level of an input port. When the logic gate is supplied with power, the logic gate immediately operates in response to an input signal. However, when power being supplied to the flip flop or register included in the sequential logic circuit is blocked, the voltage level of an output port is an unknown state. Even when the flip flop or register is re-supplied with power, the output port does not recover a certain voltage level immediately.

As described above, the combinational logic circuit and the sequential logic circuit operate differently in the case where power supply is blocked and in the case where power supply resumes, and this information should be reflected in a register included in an RTL device model.

For example, one of the registers included in the normal device model 211 described at the RTL can be described as follows:

```
module my_off (CLK, D, Q);
input CLK;
input D;
output Q;
reg Q;
always @(posedge CLK)
Q<=D;
endmodule
```

Inputs of a register named as my_off (see line 1) are CLK and D (see lines 2 and 3), and an output thereof is Q (see line 4). Line 5 states that the model 211 is the register. The input D is transmitted to the output Q in response to a positive edge of the input CLK (posedge CLK). Line 8 indicates that the definition of the module ends.

An example of the power off device model 212 described at the RTL is as follows:

1. module power_off (power_enable)
2. input powr_enable;
3. always @(power_enable)
   if (power_enable ==0)
     my_ff.Q<='z'
4. endmodule When power_enable becomes "0", that is, when power is ordered to be blocked, the power off device model compulsorily changes the state of the output Q of the register my_off to a high impedance state, z. When power_enable returns to "1", that is, when power supply is ordered, the input D is transmitted to the output Q of the register my_off in response to the input signal CLK.

By using the power off device model, operational characteristics of a device when power is supplied can be verified at the RTL.

Figure 3:
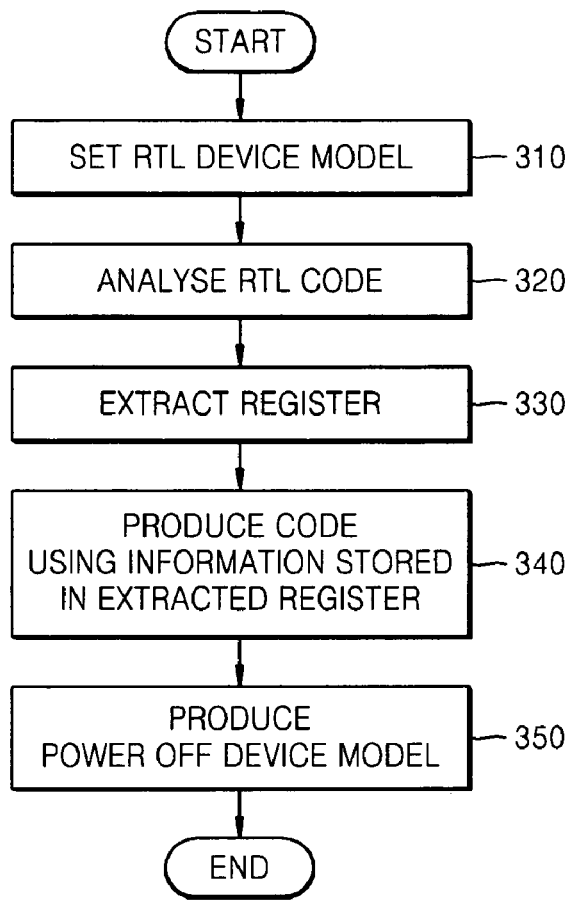
FIG. 3 is a flowchart illustrating a method of modeling a power off effect, according to an exemplary embodiment of the present invention.

FIG. 3 is a flowchart illustrating a method of modeling a power off effect, according to an exemplary embodiment of the present invention. Referring to FIG. 3, the method includes an operation 310 of specifying a device model in a hardware definition language, an operation 320 of analyzing an RTL code, an operation 330 of extracting a register, and an operation 340 of producing a code.

In operation 310, function blocks which perform corresponding functions using a plurality of power sources are described at the RTL. In operation 320, the RTL code of a preset device model is analyzed. In operation 330, parameters corresponding to function blocks that use powers that are blocked among the powers are extracted. Hence, both the operation 320 of analyzing the RTL code and the operation 330 of extracting registers may be considered as an operation of extracting parameters. In operation 340, when the power sources are blocked, the extracted parameters can produce a code is produced so that the function blocks indicated by the extracted parameters output a predetermined logic state. In operation 350, the power off device model 212 can be produced using the code.

The function blocks denote registers that constitute a sequential logic circuit. The predetermined logic state output by the function blocks is an electrically high impedance.

Figure 4:
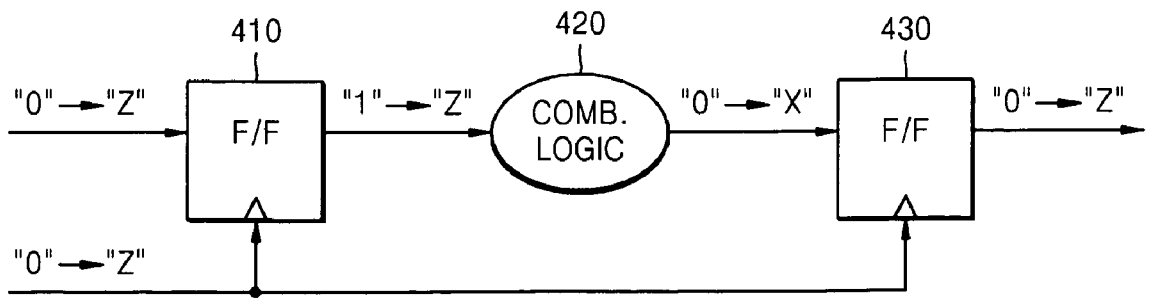
FIG. 4 illustrates a logic state of a device that describes a power off effect.

FIG. 4 illustrates a logic state of a device that describes a power off effect. Referring to FIG. 4, when power is blocked, outputs of registers 410 and 430 which constitute a sequential logic circuit compulsorily have a high impedance state, namely, "z" state, and a combinational logic circuit 420 outputs an unknown state, namely, "x" state.

As described above, a power off device model capable of obtaining the same effect as the power off effect is added to a general device model that describes a to-be-designed function at the RTL so that an operation of a device upon blockade of power can be verified at the RTL. In an exemplary embodiment of the present invention, a model for a test input signal upon blockade of power and a model for a test output signal output in response to the test input signal are included in the model for verifying the power off effect of a device at the RTL.

In a method of verifying the power off effect of a design entity of a digital system and a method of modeling the power off effect, according to exemplary embodiments of the present invention, an operation of a device when a plurality of power sources are blocked can be verified using a device model described in a hardware definition language at the RTL, and the time and cost to design the device may be reduced.

A system for verifying the power off effect of a design entity of a digital system, according to an exemplary embodiment of the present invention, includes means for specifying a device model in a hardware definition language, at a register transfer level (RTL), such as a general purpose computer system comprising any suitable architecture. The device model describes function blocks for performing predetermined functions using a plurality of power sources, and includes a model for a case where all of the power sources are supplied and a model for a case where one or more of the power sources are blocked.

A system for verifying the power off effect of a design entity of a digital system further includes means for specifying a test input signal model at the RTL describing a test input signal to be input to the design entity to verify the case where all of the power sources are supplied and the case where one or more of the power sources are blocked, and means for specifying a test output signal model at the RTL describing a test output signal to be output from the design entity in response to the test input signal.

It is to be understood that exemplary embodiments of the present invention may be implemented in various forms of hardware, software, firmware, special purpose processors, or a combination thereof. In one embodiment, the present invention may be implemented in software as an application program tangibly embodied on a program storage device. The application program may be uploaded to, and executed by, a machine comprising any suitable architecture.

According to an exemplary embodiment of the present invention, there is provided a program storage device readable by machine, tangibly embodying a program of instructions executable by the machine to perform method steps for verifying the power off effect of a design entity of a digital system, the method steps comprising: specifying, in a hardware definition language, a device model at a register transfer level (RTL), the device model describing function blocks for performing predetermined functions using a plurality of power sources, and including a model for a case where all of the power sources are supplied and a model for a case where one or more of the power sources are blocked; specifying a test input signal model at the RTL describing a test input signal to be input to the design entity to verify the case where all of the power sources are supplied and the case where one or more of the power sources are blocked; and specifying a test output signal model at the RTL describing a test output signal to be output from the design entity in response to the test input signal.

According to an exemplary embodiment of the present invention, there is provided a program storage device readable by machine, tangibly embodying a program of instructions executable by the machine to perform method steps for modeling the power off effect for verifying the power off effect of a design entity of a digital system, the method steps comprising: in a hardware definition language, specifying a device model that describes, at a register transfer level, function blocks which perform corresponding functions using a plurality of power sources; extracting parameters corresponding to the function blocks associated with power sources that are blocked, among the plurality of power sources, by analyzing the device model; and producing a code such that the function blocks indicated by the extracted parameters output a predetermined logic state.

Although the exemplary embodiments of the present invention have described in detail with reference to the accompanying drawings for the purpose of illustration, it is to be understood that the inventive processes and apparatus should not be construed as limited thereby. It will be readily apparent to those of reasonable skill in the art that various modifications to the foregoing exemplary embodiments can be made without departing from the scope of the invention as defined by the appended claims, with equivalents of the claims to be included therein.

What is claimed is:

1. A method of verifying a power off effect of a design entity of a digital system, the method comprising:
   in a hardware definition language, specifying a device model at a register transfer level (RTL), the device model describing function blocks for performing predetermined functions using a plurality of power sources having different voltage levels, and including a model for a case where all of the plurality of power sources are supplied and a model for a case where one or more of the plurality of power sources are blocked to the device model;

specifying a test input signal model at the RTL describing a test input signal to be input to the device model to verify a case where all of the plurality of power sources are supplied to the device model and a case where one or more of the plurality of power sources are blocked to the device model; and specifying a test output signal model at the RTL describing a test output signal to be output from the device model, including data anticipated to be output in response to the test input signal where all of the plurality of power sources are supplied to the device model and data anticipated to be output in response to the test input signal where one or more of the plurality of power sources are blocked.

2. The method of claim 1, wherein when some of the plurality of power sources are blocked, the model for the case where some of the power sources are blocked changes the logic states of outputs of function blocks to a predetermined logic state, wherein the function blocks are associated with the blocked power sources.

3. The method of claim 2, wherein the function blocks comprise a sequential logic circuit.

4. The method of claim 3, wherein the function blocks are registers.

5. The method of claim 2, wherein the predetermined logic state is a high-impedance state.

6. A method of modeling a power off effect, comprising:
in a hardware definition language, specifying a device model that describes, at a register transfer level (RTL), plurality of function blocks which perform corresponding functions using a plurality of power sources having different voltage levels;
extracting parameters corresponding to function blocks, among the plurality of function blocks, associated with power sources that are blocked, among the plurality of power sources, by analyzing the device model; and
producing a code such that the function blocks indicated by the extracted parameters output a predetermined logic state.

7. The method of claim 6, wherein the function blocks corresponding to the blocked power sources comprise a sequential logic circuit.

8. The method of claim 7, wherein the function blocks are registers.

9. The method of claim 6, wherein the predetermined logic state is a high-impedance state.

10. A system for verifying a power off effect of a design entity of a digital system, the system comprising:
means for specifying, in a hardware definition language, a device model at a register transfer level (RTL), the device model performing predetermined functions using a plurality of power sources having different voltage levels, and including a model for a case where all of the plurality of power sources are supplied and a model for a case where one or more of the plurality of power sources are blocked to the device model;
means for specifying a test input signal model at the RTL describing a test input signal to be input to the device model to verify a case where all of the plurality of power sources are supplied and a case where one or more of the plurality of power sources are blocked to the device model; and
means for specifying a test output signal model at the RTL describing test output signal to be output from the device model, including data anticipated to be output in response to the test input signal where all of the plurality of power sources are supplied to the device model and data anticipated to be output in response to the test input signal where one or more of the plurality of power sources are blocked.

11. A program storage device readable by machine, tangibly embodying a program of instructions executable by the machine to perform method steps for verifying a power off effect of a design entity of a digital system, the method steps comprising:
specifying, in a hardware definition language, a device model at a register transfer level (RTL), the device model describing function blocks for performing predetermined functions using a plurality of power sources, and including a model for a case where all of the plurality of power sources are supplied and a model for a case where one or more of the plurality of power sources are blocked to the device model;
specifying a test input signal model at the RTL describing a test input signal to be input to the device model to verify a case where all of the plurality of power sources are supplied and a case where one or more of the plurality of power sources are blocked to the device model; and
specifying a test output signal model at the RTL describing a test output signal to be output from the device model, including data anticipated to be output in response to the test input signal where all of the plurality of power sources are supplied to the device model and data anticipated to be output in response to the test input signal where one or more of the plurality of power sources are blocked.

12. A program storage device readable by machine, tangibly embodying a program of instructions executable by the machine to perform method steps for modeling a power off effect and for verifying the power off effect of a design entity of a digital system, the method steps comprising:
in a hardware definition language, specifying a device model that describes, at a register transfer level (RTL), a plurality of function blocks which perform corresponding functions using a plurality of power sources having different voltage levels;
extracting parameters corresponding to function blocks, among the plurality of function blocks, associated with power sources that are blocked, among the plurality of power sources, by analyzing the device model; and
producing a code such that the function blocks indicated by the extracted parameters output a predetermined logic state.

* * * * *